United States Patent [19]

Reeb

[11] Patent Number: 5,291,180
[45] Date of Patent: Mar. 1, 1994

[54] LC STRUCTURE USEFUL IN RADIO FREQUENCY SECURITY SYSTEMS

[76] Inventor: Max-E. Reeb, Mozartstr. 29, D-7320 Göppingen, Fed. Rep. of Germany

[21] Appl. No.: 883,248

[22] Filed: May 7, 1992

Related U.S. Application Data

[60] Continuation of Ser. No. 586,694, Sep. 24, 1990, abandoned, which is a division of Ser. No. 135,547, Dec. 18, 1987, Pat. No. 4,990,891, which is a continuation of Ser. No. 28,893, Mar. 23, 1987, abandoned, which is a division of Ser. No. 513,970, Jun. 29, 1983, Pat. No. 4,694,283.

[30] Foreign Application Priority Data

Oct. 30, 1981 [DE] Fed. Rep. of Germany ....... 3143208

[51] Int. Cl.⁵ ............................................. G08B 13/24
[52] U.S. Cl. .................................................. 340/572
[58] Field of Search ......................................... 340/572

[56] References Cited

U.S. PATENT DOCUMENTS 4,694,283 9/1987 Reeb .
4,990,891 2/1991 Reeb .

Primary Examiner—Glen R. Swann, III

[57] ABSTRACT

The proposed LC structure is comprised of a flexible insulative layer folded back on itself about a predetermined foldline, said insulative layer having on one surface an electrically conductive layer configured to form first and second alike planar multi-turn spirals which, in a like folded superposition, counter turn against each other (if viewed from the same side) alinged face-to-face, and turn by turn, spaced by said folded flexible insulative layer. At least first and second substantially two-dimensionally shaped conductive layer portions connect to said first and second multi-turn spirals on opposite sides of said foldline, thereby juxtaposing each other and having sandwiched therebetween at least said dielectric layer, and leaving between each other an elongated region in which said conductive layer is predominantly absent, for thus opposing any tendency of said layers to fold along any line other than said predetermined foldline.

29 Claims, 10 Drawing Sheets

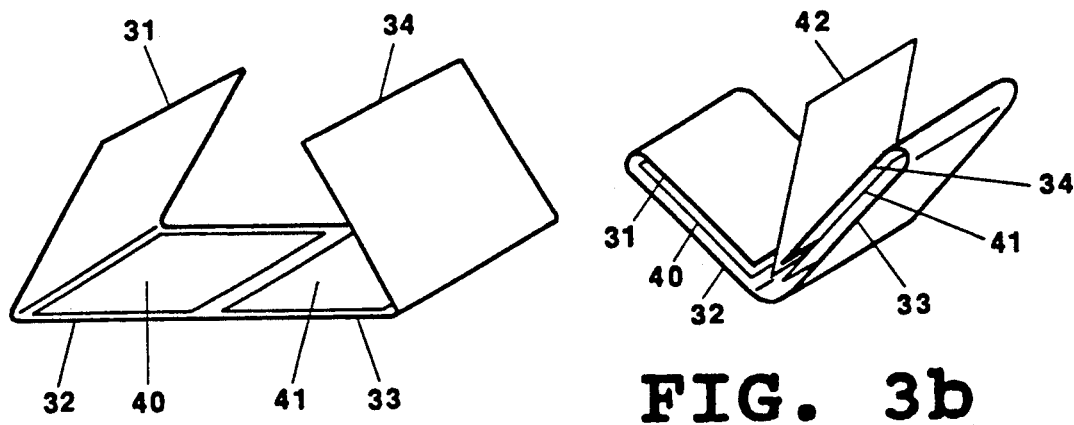
FIG. 3a
FIG. 3b
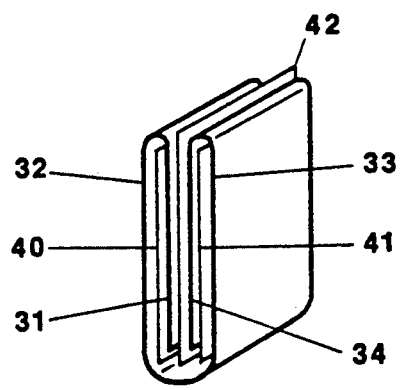
FIG. 3c
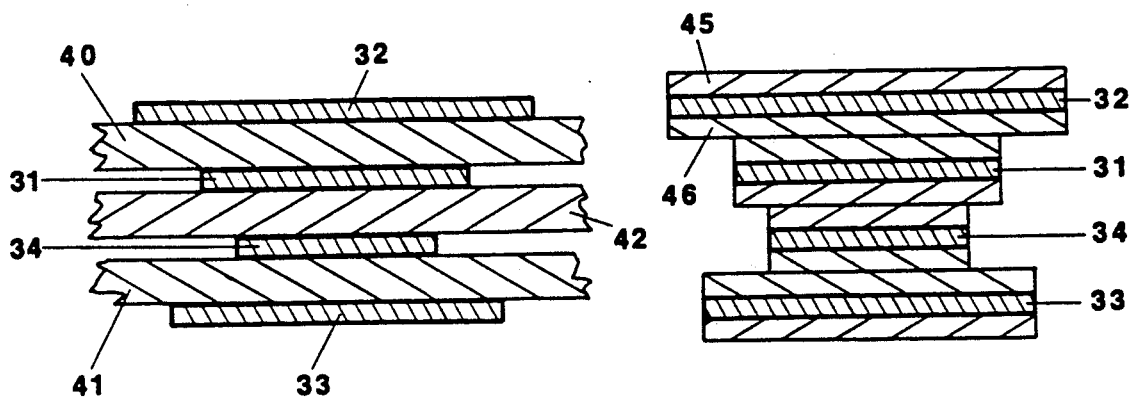
FIG. 4
FIG. 5

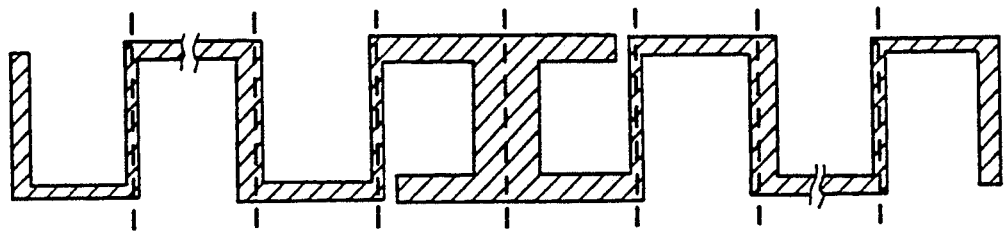
FIG. 14
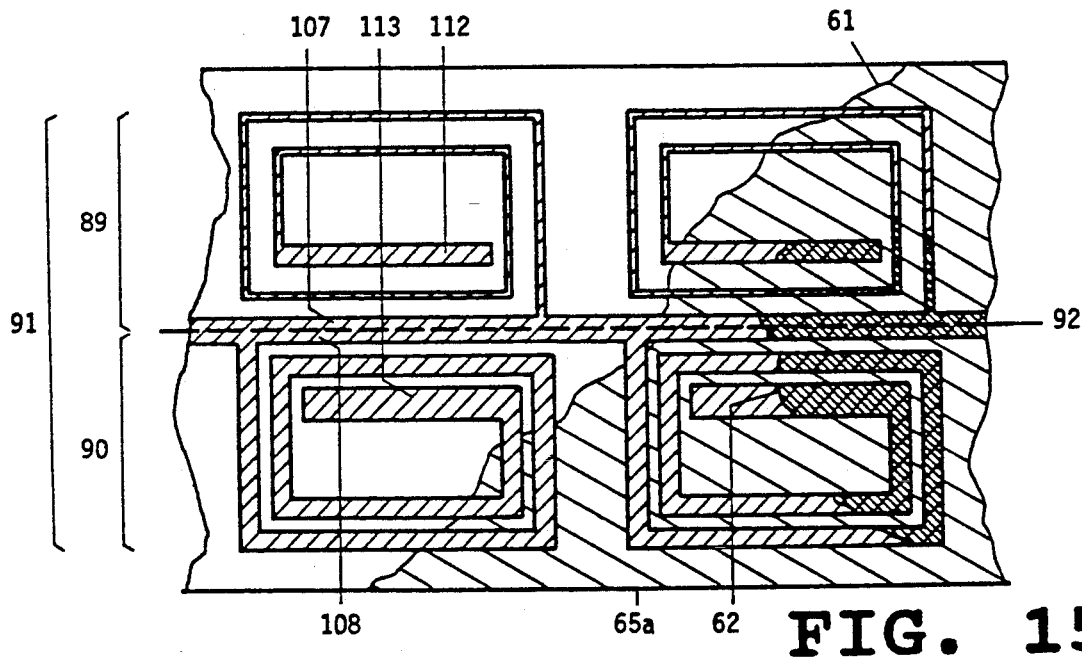
FIG. 15
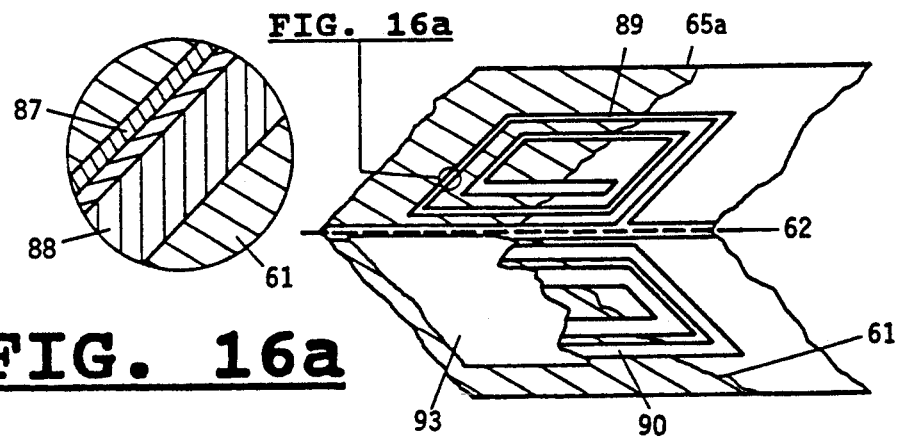
FIG. 16a
FIG. 16

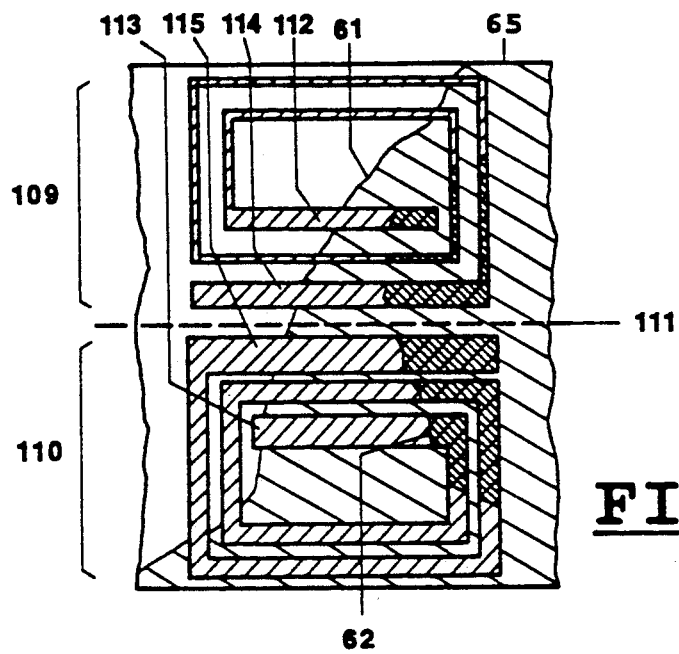
FIG. 17
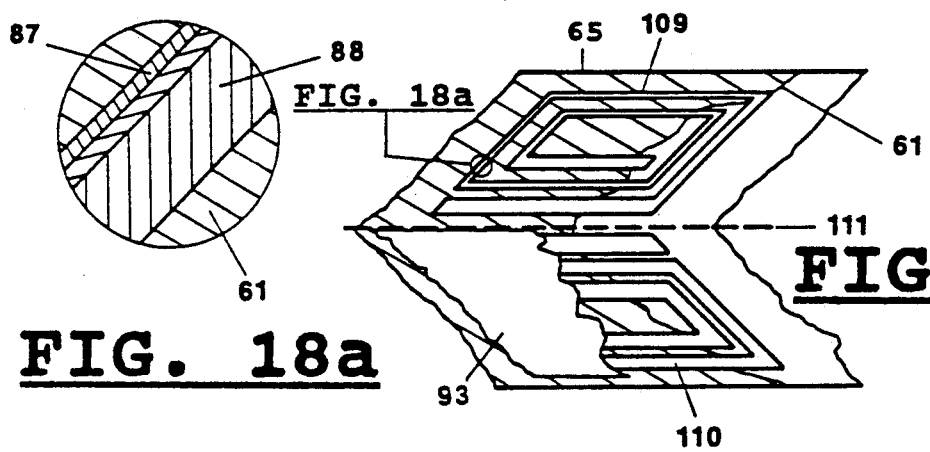
FIG. 18a
FIG. 18
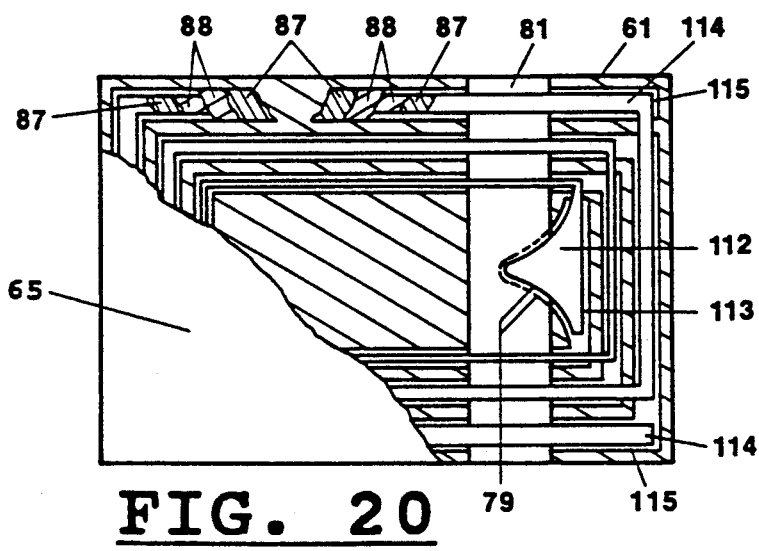
FIG. 20

LC STRUCTURE USEFUL IN RADIO FREQUENCY SECURITY SYSTEMS

CROSS-REFERENCE TO RELATED APPLICATIONS

This application is a continuation of application Ser. No. 07/586,694 filed on Sep. 24, 1990 (abandoned), which is a division of application Ser. No. 07/135,547, filed on Dec. 18, 1987, now U.S. Pat. No. 4,990,891, which is a continuation of application Ser. No. 07/28,893, filed on Mar. 23, 1987 (abandoned), which is a division of application Ser. No. 06/513,970 filed on Jun. 29, 1983, now U.S. Pat. No. 4,694,283.

BACKGROUND OF INVENTION AND FIELD OF INVENTION

The invention concerns an LC structure useful as an RF interrogatable transponder means in electronic security systems for alarming the presence of said LC structure in an RF electromagnetic field within a security zone.

LC structures of the aforementioned type have become known from U.S. Pat. No. 3,913,219, issued Oct. 21, 1975 ("Planar Circuit Fabrication Process", Inventor LICHTBLAU). Said Patent describes a planar circuit comprising a flexible dielectric sheet having an inductively reacting conductive spiral path bonded to one side thereof. Said spiral path terminates, at either ends, into first and second conductive areas which are mutually aligned and spaced by said dielectric sheet, thus forming a lumped capacitor. Said capacitor and said conductive spiral cooperate to form an LC resonant structure. Similar LC structures are described in U.S. Pat. Nos. 3,863,244, 3,967,161, and 4,021,705. All of these LC structures exhibit four essential characteristics. (1) The inductor configures as a single conductive spiral. (2) First conductive material is arranged to react inductively only. (3) Second conductive material is arranged to react capacitively only. (4) An electrical through-contact must be provided through said flexible dielectric sheet. Attempts to make these LC structures small in size detrimentally affect their detectability within security systems, from the following reasons. Wasting on the LC structure's area first metal for reacting inductively only and second metal for reacting capacitively only leads to a highly progressive metal coverage of the LC structure's real estate, the more structure size is reduced, provided said dielectric sheet cannot undergo a certain thickness. The thus high metal coverage of the LC structure's real estate disperforms manifoldly: Firstly, all portions of the conductive spiral path themselves form infinitesimal short circuit loops, resulting in an inherent decrease of inductor's inductance considerably below the maximum inductance attainable with inductor paths configured like the spring of a watch. Consequently, such planar spiral inductor's inductance and Q are detrimentally reduced versus reduction of planar spiral size. Secondly, exactly that metal provided to desirably form a capacitor only, and that are the capacitor plates, in the manner of a much wider short circuit loop effects a deleterious reduction of inductance, too. Hence, larger capacitor plates are required for a resonance at a predetermined frequency, which larger conductive plates even more reduce the structure inductance, and progressively so on. It is understood, that the efficiency of the metal input for attaining a desired resonance and detectability performance output is getting worse versus a decrease of LC structure's size, in a highly progressive manner. Thirdly, the more metal is arranged on a planar LC structure's real estate, the more eddy current counter induction takes place, resulting in an undesired distortion effect on an interrogating RF magnetic field to thus have it bypass the LC structure, rather than guiding an utmost number of field lines through the interior thereof to thereby maximize the effect on an interrogating security system.

U.S. Pat. No. 4,369,557, issued Jan. 25, 1983 ("Process for Fabricating Resonant Tag Circuit Constructions", Inventor VANDEBULT) describes an LC structure which overcomes the need for an electrical contact through an insulative sheet. This LC structure also comprises an inductor and a lumped capacitor. The inductor is formed of two conductive spiral paths bonded to one face of a continuous and flexible dielectric sheet, one spiral path juxtaposed and in electrical communication to the other. The non-juxtaposing ends of said spiral paths terminate in first and second capacitor plates on same face of said dielectric sheet. Said sheet is folded towards itself so that first and second capacitor plates superpose each other in alignment, spaced by the double thickness of said dielectric sheet, the latter thereby also insulating one from another first and second turns of said conductive spiral paths to thus form a continuous dual layer coil of uniform turn direction. Respective inductor portions, i.e. respective turns of first and second spiral paths are substantially misaligned with respect to one another, whereby capacitive coupling between said first and second inductor portions through the double layered dielectric sheet is minimized. The capacitor plates and the double layer of said dielectric sheet are laminated together to thereby form a defined lumped resonance capacitance. A minimized capacitance between inductor turns is attained by that the inductor turn region is not laminated. This is, since turn-to-turn leakage capacitances to result are subject to deviations in response to the degree of mutual misalignment of inductor turns. Thus, the higher the lumped capacitance between lumped capacitor plates is made, the closer tolerances of a resonant frequency can be attained, and vice versa. Hence, in view of the above-mentioned distortion effect on a scanning RF electromagnetic field this building scheme comes even shorter since a practically folding dielectric sheet cannot undergo the thickness as known from the Lichtblau construction, however, becomes effective with its double thickness between capacitor plates, which leads to an even higher progressive metallization of a small LC structure's real estate and thus to a lowered inductance and considerable limitations and restrictions of such LC structure in its practical use.

It is understood that when such constructions are required in large quantities, the production costs are of essential significance.

SUMMARY OF THE INVENTION

A first object of the invention is to provide an LC structure which is very reliable in use. A second object of the invention is to provide an LC structure that exhibits close tolerances of a resonant frequency, and lends itself to low cost make. A third object of the invention is to provide an LC structure having a high long-term reliability.

The first object is achieved by an LC structure comprised of two planar spiral patterns formed of conductor strips and having multiple turns arranged mutually aligned turn by turn and turn portion by turn portion, so as to cover each other, in a counter turning relationship when viewed from the same side, and spaced from one another by at least one insulative layer, thereby forming a plurality of concentric stripline loops. Between any two mutually superposed conductor strips a certain capacitance exists. The total of all these capacitances and the inductance of the conductor strips suffice for a resonance capability of the LC structure without particular capacitor plates, by that the effective capacitance distributes along all insulatively spaced conductor strips. This scheme of utilizing as an useful and very precisely transforming circuit capacitance what works as an undesired leakage capacitance in constructions according to U.S. Pat. No. 4,369,557 overcomes the need for lumped capacitor plates and thus minimizes the metallization of the real estate of a respective LC structure, thereby minimizing the performance dropping distortion effect on an energizing RF electromagnetical field as a result of eddy current counter induction.

The conductive spiral patterns may be individual or embody as a one-piece, and are folded back towards themselves, together with at least one insulative layer to which said spiral patterns are affixed, so that the faces of said patterns are insulatively spaced from one another. If the patterns form a one-piece, then the patterns are in electrical communication with one another across the fold region. At least a dielectric path, or a continuous sheet, or a combination of layers may space said spiral patterns.

Both the inherently low electromagnetic field distortion and—owing to the definitely aligned superposition of pairs of inductor turns—the stable resonant characteristics make the new LC structure very reliable in practical use within RF electromagnetic interrogation systems.

The second object is achieved by that the conductor strips have different configurations and/or dimensions in the superposed areas, particularly different widths. Thereby but small capacitance deviations result from mutual alignment errors within limits for close tolerances of the resonant frequency. Further, a minimization of leakage capacitances, and thus optimized RF characteristics may be achieved by that a dielectric is provided only in the projected spaces between one another superposing portions of said conductive spiral patterns, rather than across lateral turn-to-turn areas.

The third object is achieved by that the superposed conductive spiral patterns are either electrically insulated from one another, and hence do not take any electrical contact to be made, or configure as an integral one-piece, so that the need for making an electrical connection is basically overcome. As a consequence, any product weakness owing to the potential long-term unreliability of whatsoever electrical interconnection through flexible insulative layers is thus overcome.

In order to minimize the manufacturing costs of an LC structure according to the invention the conductor path patterns may be cut or punched or etched out of a metal foil. However, the patterns may as well be vapor-deposited, sprayed or applied in other conventional ways, e.g. by electrodeposition or the like, on a flexible electrically non-conductive carrier sheet. The dielectric may be applied directly on respective conductor path pattern portions in the form of a coating, or a dielectric film, or a sheet. Optionally at least one adhesive layer may be inserted for effecting at least a fixing together of superposed parts.

Since the conductor strips may be made extremely thin, a sufficiently high inductance and capacitance value can be achieved and a device to incorporate the LC structure also can be made very thin. Hence, a respective device can be made highly flexible and, in particular, can be processed like a conventional paper, plastic or cardboard tag.

In order to protect the finished LC structure it may be sealed on a flexible and electrically insulative cover sheet or may be embedded into a flexible electrically insulating composition and thus given a more rigid shape to appear e.g. as a conventional tag- or card-like device. Though the LC structure consists of various layers, a respective device to incorporate it may be thin and flexible so that, if a plurality of individual LC structures is covered with a continuous carrier sheet to thus form an endless plurality of individual devices, a plurality of LC structures can thus be rolled up into a supply roll.

LC structures according to this invention, despite assembling from a minimum count of inexpensive materials and despite low manufacturing costs exhibit close tolerances of their radio frequency characteristics at a satisfactory Q-factor. Particularly when made small in size they offer an unprecedented in-system detectivity as a result of an unprecedented low distortion effect on a scanning RF electromagnetic field they are subjected to for detection.

Further advantages and features of the invention will become apparent from the following description of several examples of the invention with reference to the attached drawing, from the subclaims, and from the drawing. In the drawing FIG. 1 shows a schemmatic view of a conductor strip structure developed into a plane which; when suitably folded together, results in an inductive member;

FIG. 2 is a sectional view of a conventional strip line;

FIGS. 3a, 3b, and 3c shows several schematic views for explanation of folding of the conductor strip structure illustrated in FIG. 1;

FIGS. 4 and 5 are partial sections through the folded structure shown in FIG. 3;

FIG. 14 is a plan view on a conductor strip structure for the manufacture of an identification device with eight or more superposed fold planes;

Figure 19:
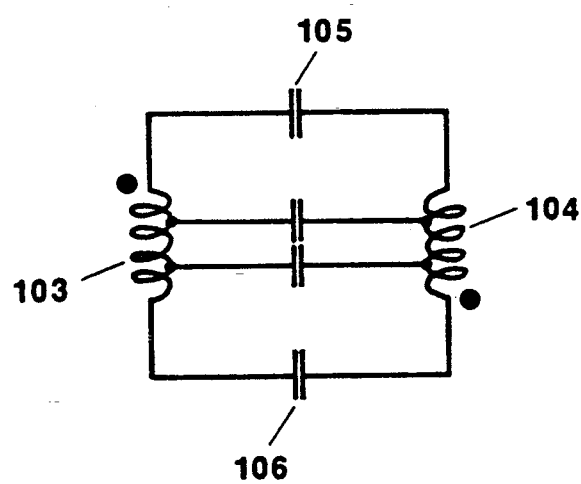

FIGS. 15 16, and 16a are schematic views for explanation of the manufacture of an identification device with only two fold planes;

FIGS. 17 18, and 18a are schematic views for explanation of an embodiment in which only capacitive coupling exists between two superposed planes;

FIG. 19 is an equivalent circuit diagram of the embodiment of FIGS. 17 and 18; and FIG. 20 is a schematic view for explanation of the adjustment of the capacitive member in the embodiment of FIGS. 17 and 18 by means of a dielectric adjustment tape.

Figure 21:
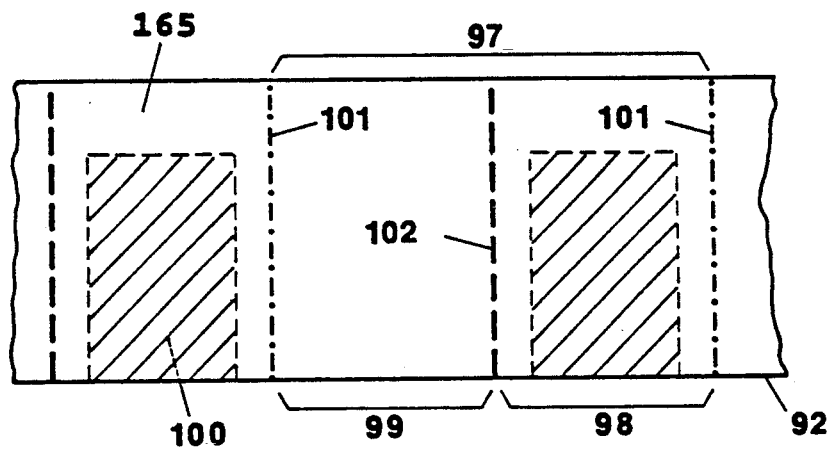
Figure 22:
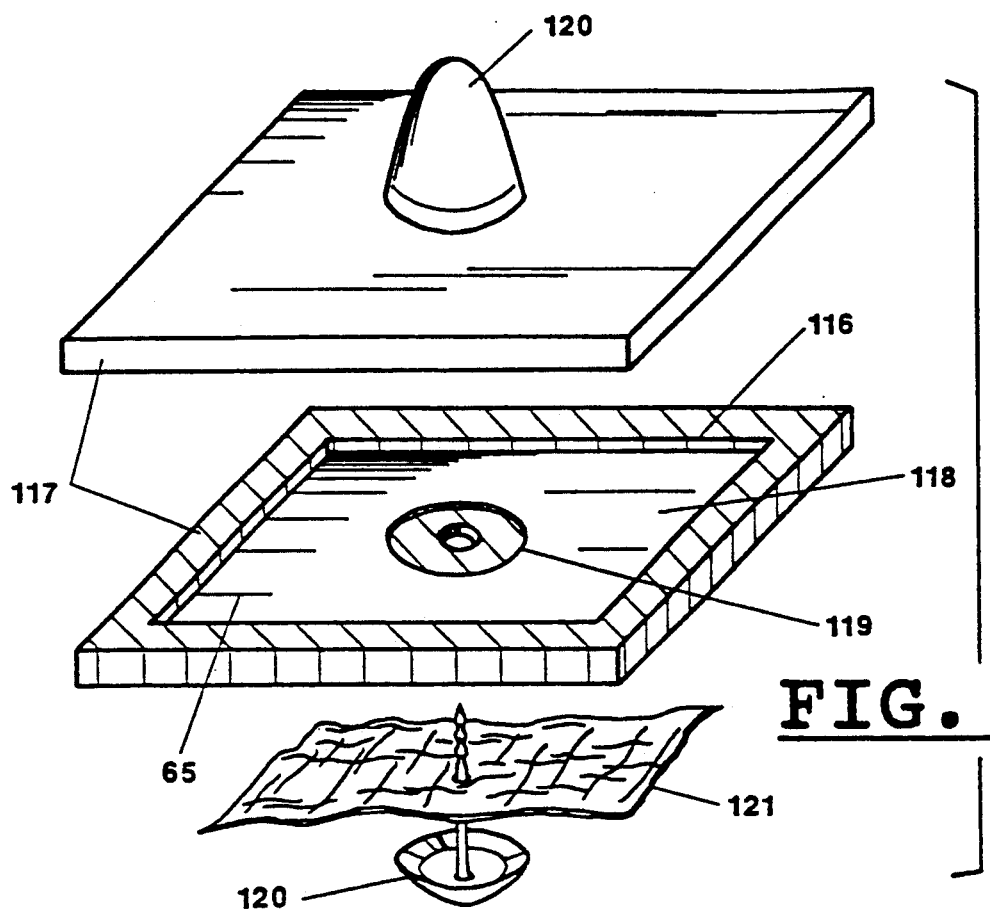
Figure 23:
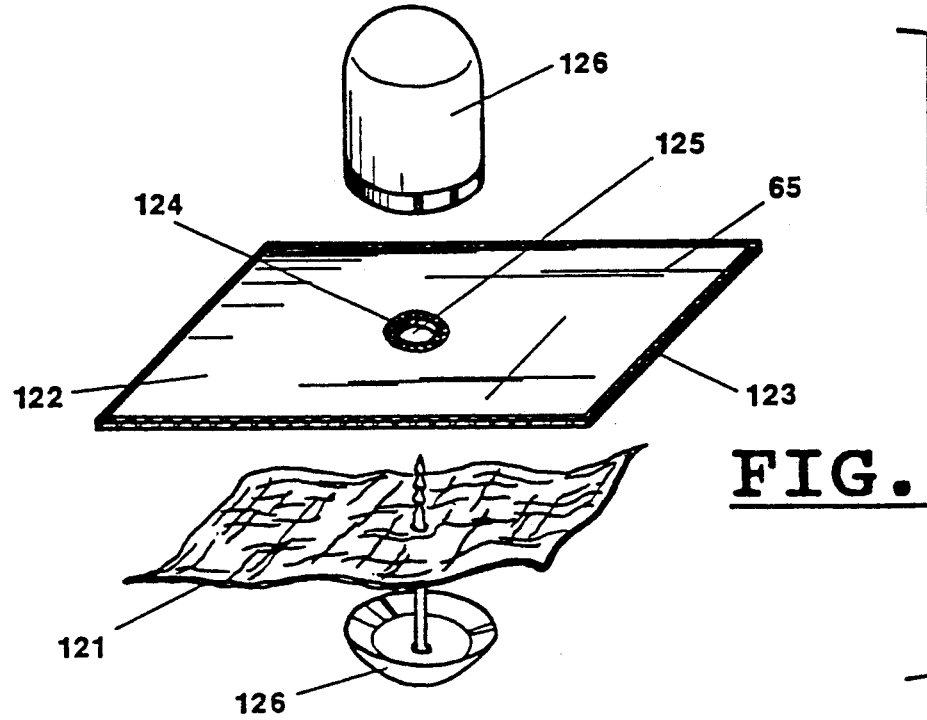

FIG. 21 shows a schematic plan view of a strip-shaped carrier alternately provided with an area carrying an identification device and a vacant area;

FIG. 22 shows an exploded view for explanation how an identification device of the invention can be affixed to an article to be safeguarded; and FIG. 23 is an exploded view of another embodiment of affixing an identification device to an article to be safeguarded.

The chief element of the identification device of the invention is an electric unit constituting a parallel resonant circuit and is formed of an inductive member and distributed capacities. Hereafter this electrical unit will first be described.

Since the described identification device can be manufactured especially rapidly and simply with a minimum of waste of raw material, it is especially useful for provision in merchandise price tags and safeguarding tags.

Figure 1:
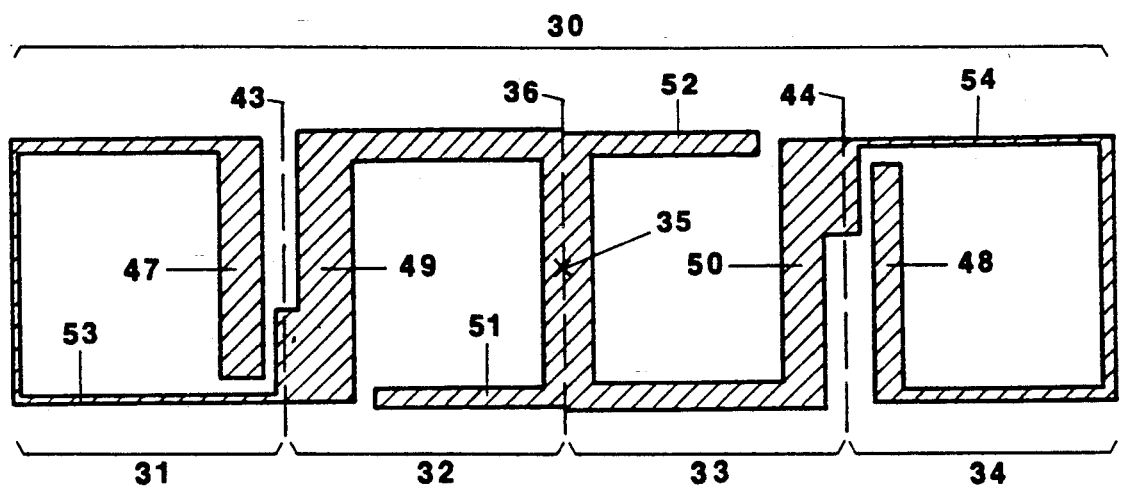
Figure 2:
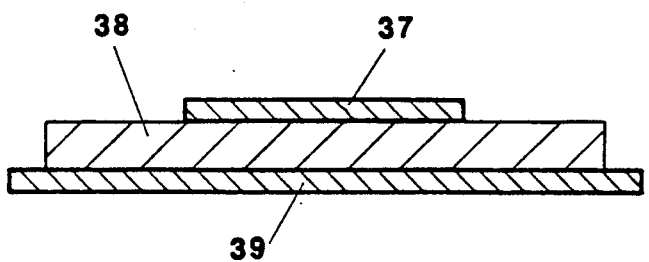

From a thin metal foil which may already be inseparably coated on one or both sides with suitable dielectric coatings a planar structure 30 having the structure of a conductor strip as shown in FIG. 1 is produced. It is an essential property of the conductor strip structure consisting of four coherent partial structures 31 to 34 (hereinafter termed "leaves" and illustrated in simple sketches as continuous leaves that, although it appears to be symmetrical with respect to the center point 35, all the conductor strip portions symmetrically opposed with respect to the axis 36 have different widths so that symmetrical pairs differ in width only by one width step. By way of explanation FIG. 2 is a cross section through a strip conductor consisting of a wave guide strip 37, a dielectric of constant thickness 38, and a ground area 39 which is larger than the width of the wave guide strip. When the wave guide strip is laterally shifted this does not affect the capacitor coating thereof. In case the conductor strip structure shown in FIG. 1 is manufactured from uncoated metal foil, it will be folded as shown in the simplified sketches of FIGS. 3a-3c with interposition of the dielectric layers 40, 41 and 42 along the fold lines 43, 44 and 36 in FIG. 1 so as to result in a cross section through any desired part along the margin of the folded assembly shown in FIG. 4. In case the conductor strip structure shown in FIG. 1 is manufactured from a metal foil previously laminated with suitable dielectric coatings 45 and 46 the insertion of the layers 40, 41 and 42 is unnecessary, and after analogous folding a corresponding cross sectional configuration illustrated in FIG. 5, i.e. altogether a rectangular structure with recessed inside region is obtained.

In both cases a Thomson oscillating circuit is formed having an oscillating capacity composed of the transformation of distributed conductor capacitances and concentrated capacitances of the opposed conductor strip portions 47 and 48, 47 and 49, 48 and 50. In a rough approximation the structure can be described by the equivalent circuit shown in FIG. 6; therein corresponding parts and locations are designated with the same reference numerals as in FIG. 1.

The different width in folded condition of superposed conductor strips has several functions:

(a) Inaccuracies in superposing the individual sheets hardly change the capacitance between conductor strip portions extending one above the other, as long as a positioning tolerance is maintained within geometrically simply determinable and specifiable limits. This effect can be utilized as long as the width of the conductor strips is far greater than the thickness of the dielectric separating layers and the electric field between metal layers thus extends predominantly homogeneously. As a result, the active resonant circuit capacitance is substantially invariable with respect to positioning inaccuracies on folding within registration tolerances and mainly depends on the dimensional accuracy of the conductor strips and on properties of the dielectric.

(b) Since the conductor strips mutually cover each other and the width of the conductor strips is substantially greater than the thickness of the insulating separating layers between the coil windings, the coupling of the spatially distributed windings is very firm and the mutual leakage inductance thereof is very low. This results in very constant transformation conditions for the individual distributed line capacitances.

Figure 6:
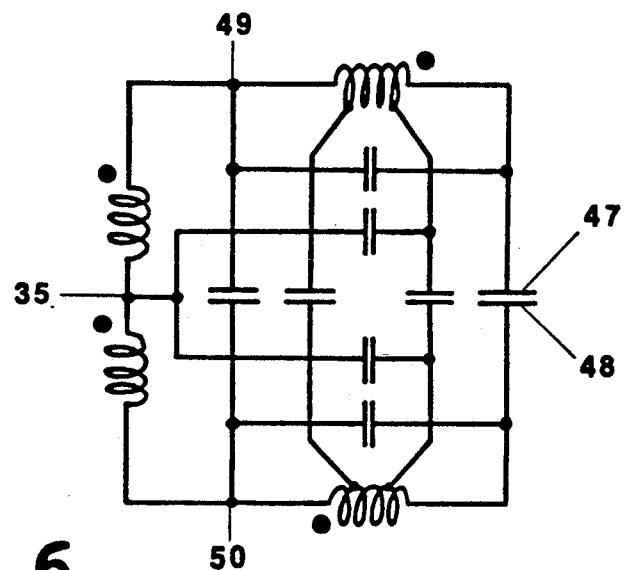
FIG. 6 is an equivalent circuit diagram of the electrical unit shown in FIGS. 3 to 5 forming a parallel resonant circuit.

(c) After having been folded together the leaves 32 and 33 of low impedance, in relation to the center point 35 of the structure in FIG. 1 and the coil center 35 of FIG. 6, are disposed at the outside of the device and enclose the leaves 31 and 34 of high impedance in relation to the same points in the manner of a static shield in the interior of the arrangement with the result that upon capacitive approach the obtained structure only slightly changes its resonant frequency. The branches 51 and 52 are not a component of the coil proper but are low impedance shielding areas which shield the higher impedance line sections 53 and 54 against the outside.

(d) The externally disposed windings of maximum conductor width, i.e. least strip resistance, are the windings where the highest current intensity occurs. Hence, the design of the device also favors the highest possible Q-factor.

Figure 7:
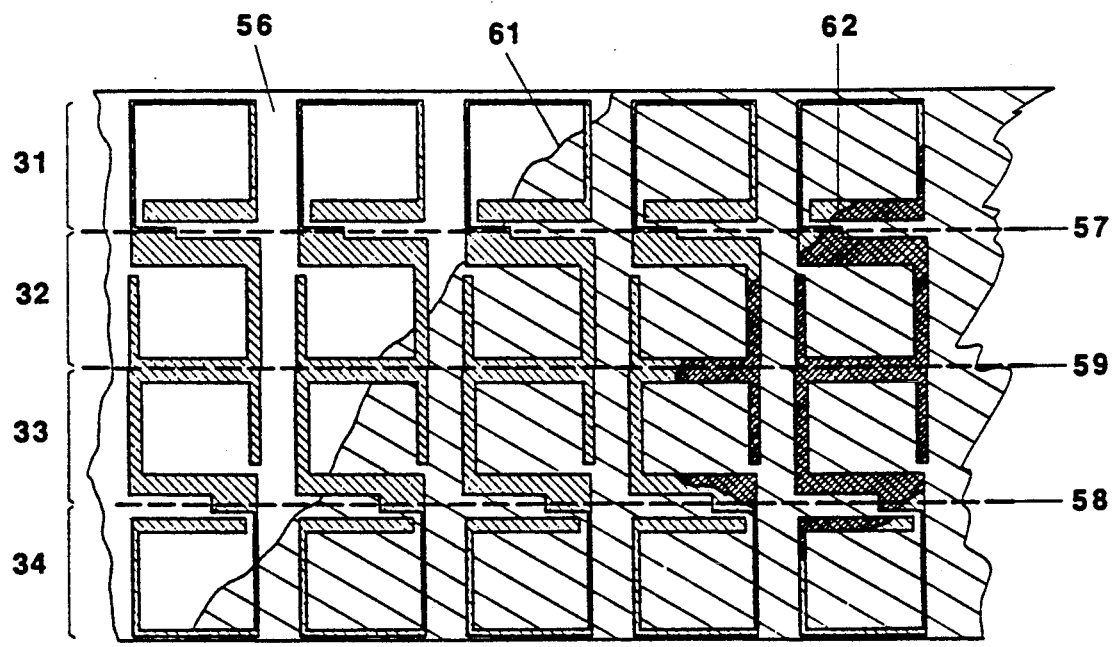
FIG. 7 is a plan view of a carrier sheet carrying a plurality of conductor strip structures for the manufacture of identification devices.

High positioning accuracy of the individual leaves placed one upon the other is ensured by positive folding. This is achieved by fixing in the production process the conductor strip structure onto a continuous carrier sheet 56 as shown in FIG. 1, and in this operation and within the same tool, the fixed structure together with the carrier sheet 56 are continuously perforated without pitch shift relative to the fixed structure along the lines 43, 44 and 36 in FIG. 1 so that perforation lines 57, 58 and 59 are formed along the direction of advance of the sheet 56, as shown in FIG. 7, along which the continuous sheet can be folded together.

The perforation is made such that an electrically conductive connection is retained through the perforated region of the structure;

that the longitudinal stiffness of the substrate material can be utilized to enhance guided folding; and that portions of the carrier sheet no longer needed can be removed once the sheet has been folded along the perforation.

If, for the production of the structure shown in FIG. 1, a metal foil dielectrically coated on both sides is used as starting material, the insertion of the coextensive insulating layers 40, 41 and 42 during folding is unnecessary. Since the active dielectric layers shown in FIG. 5 then have the smae contours as the conductor strips, the interiors and exteriors of the finally folded device are then free of any material so that the structure, when folded together, does not yet have a form stable in itself.

Figure 8:
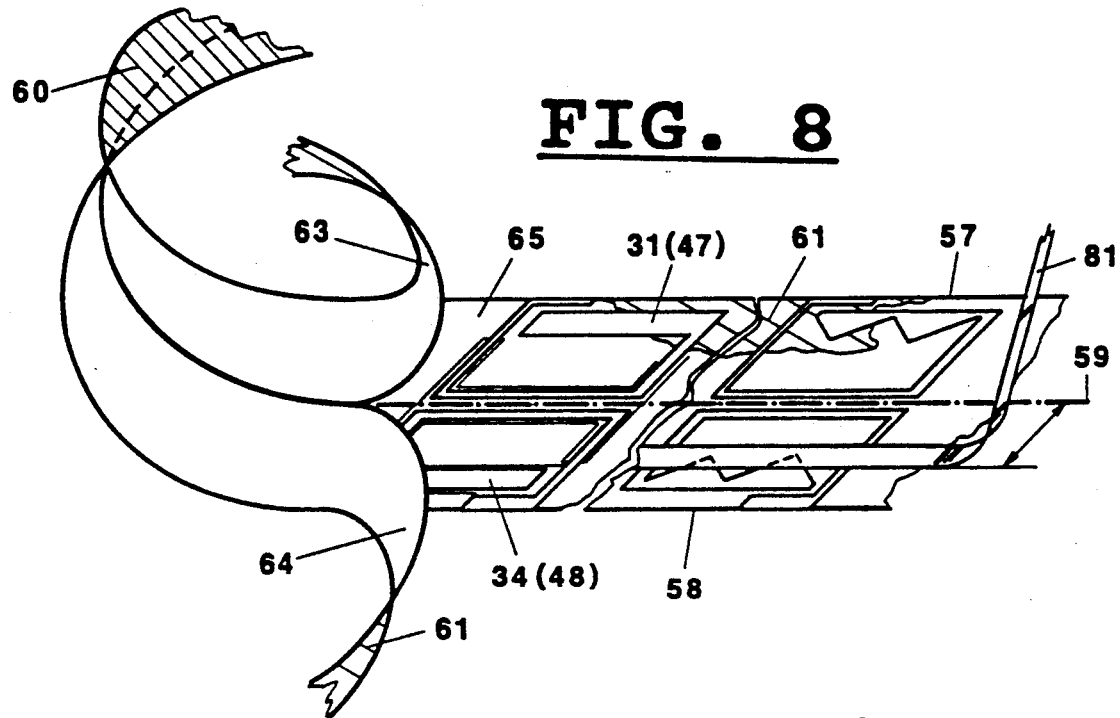
FIGS. 8, 9 and 10 are schematic views for explanation of further embodiments of the invention permitting adjustment of the capacitive member in the course of the manufacturing method.
Figure 9:
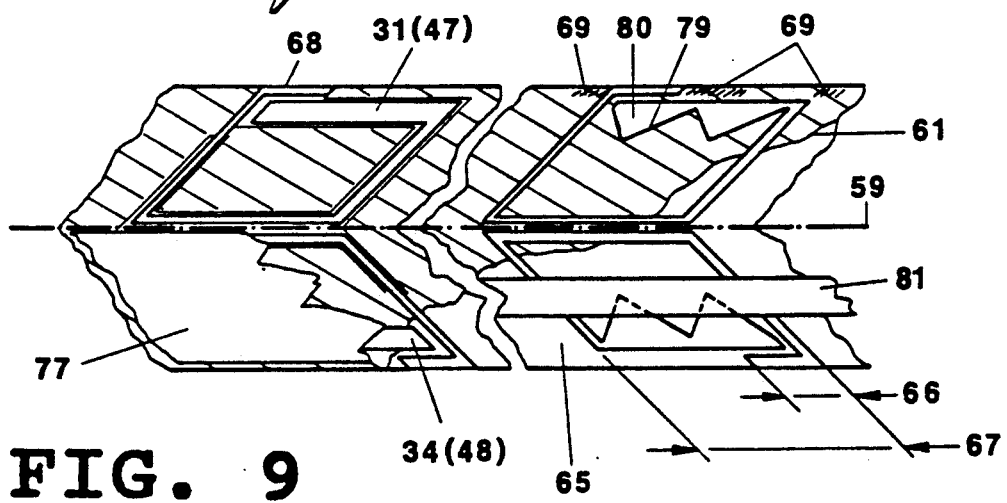

The production and dimensionally stabilizing incorporation of the unit between protective covering faces may be accomplished, in a manner shown in FIGS. 7, 8 and 9, by using as continuous carrier sheet 56 a material suited for this purpose and provided, for example, with areas 60 to be printed, and having on the free side an adhesive or sealing film 61 producing differential adhesion in the zones inside and outside the perforation lines 57 and 58 capable of being selectively activated, e.g. under the influence of pressure and/or heat. After the transfer of the structure consisting of the leaves 31 to 34 to such a carrier sheet the zone-wise differential adhesion has the effect that the leaves 32 and 33 initially adhere more firmly to the sheet 56 than do the leaves 31 and 34.

By means of a suitable method an extremely thin adhesive layer 62 is applied onto the surface of the conductor strip structure, but not onto the sheet, as indicated in FIG. 7, which, after folding along the lines of perforation 57 and 58, produces higher adhesiveness between the leaves 31, 32 and 34, 33 respectively than that initially produced between the sheets 32, 33 and the sheet 56.

After the performance of the first folding operation along the lines of perforation 57 and 58 which adhesively positions the leaves 31, 32 and 34, 33 on each other, this permits the separation and removal of carrier sheet portions 63 and 64 no longer required along the perforation lines 57 and 58, as shown in FIG. 8, without the conductor strip structure being removed from the remainder 65 of the carrier sheet. The second folding operation along the perforation line 59 then positions the leaves 31 and 34 on each other, as illustrated in FIG. 9.

When, after the last folding operation which closes the structure to form a resonant circuit, the adhesive or sealing film 61 inside the portion 65 of the carrier sheet 56 which remained as external sheath is activated in a suitable way, e.g. under the influence of pressure and/or heat, the described structural feature has the additional effect that the folded structure is sheathed not only regarding the recessed interior but is also sealed along the external perforation margins in the areas 69. This ensures high stability of the device against displacement so that the resulting strip can be rolled up into a supply roll.

Figure 11:
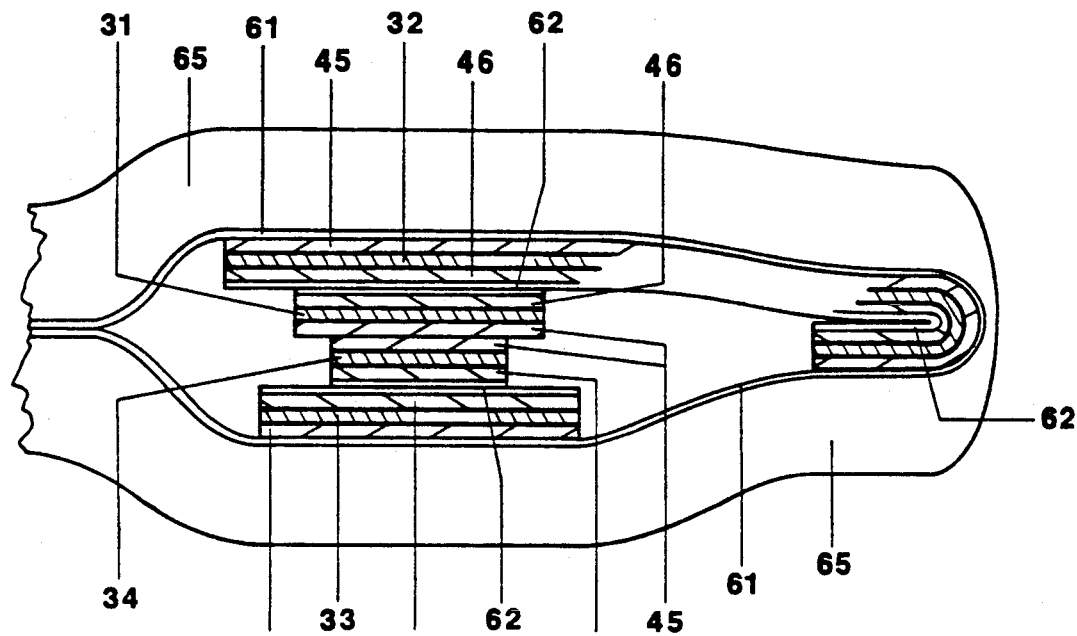
FIG. 11 is section through a marginal zone of a final identification device sealed into protective film.

By way of illustration FIG. 11 shows a cross section through the external region of a device produced in this way.

Figure 12:
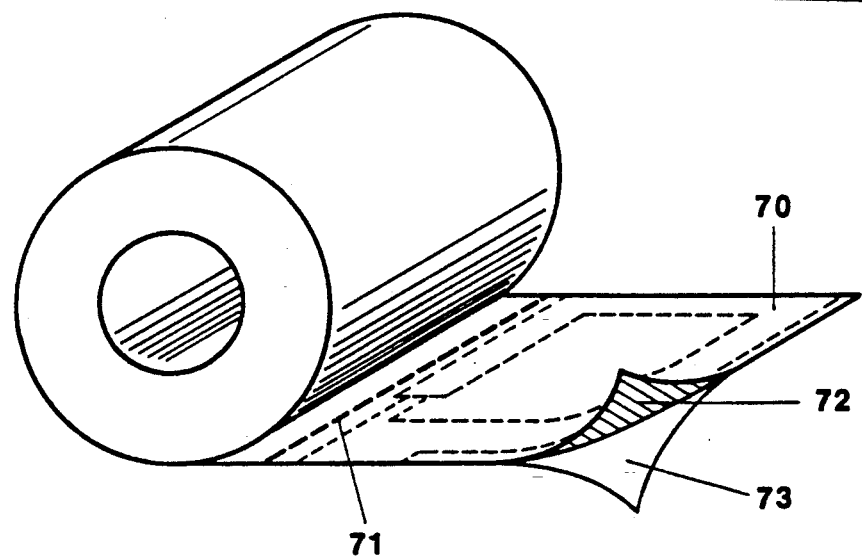
FIG. 12 is a schematic view of a carrier sheet rolled up into a supply roll into which a multiplicity of final electrical identification devices are sealed and which is adhesive.

Addording to FIG. 12, with this method a great number of thin and flexible resonant members 70 can be produced which are encased in a continuous sheath. They can be either cut off individually from said continuous strip or, after a severing perforation 71 and provision with pressure sensitive adhesive 72 and delaminating film 73, can be flexibly transferred to articles by means of automatic roll-off dispensers.

Figure 10:
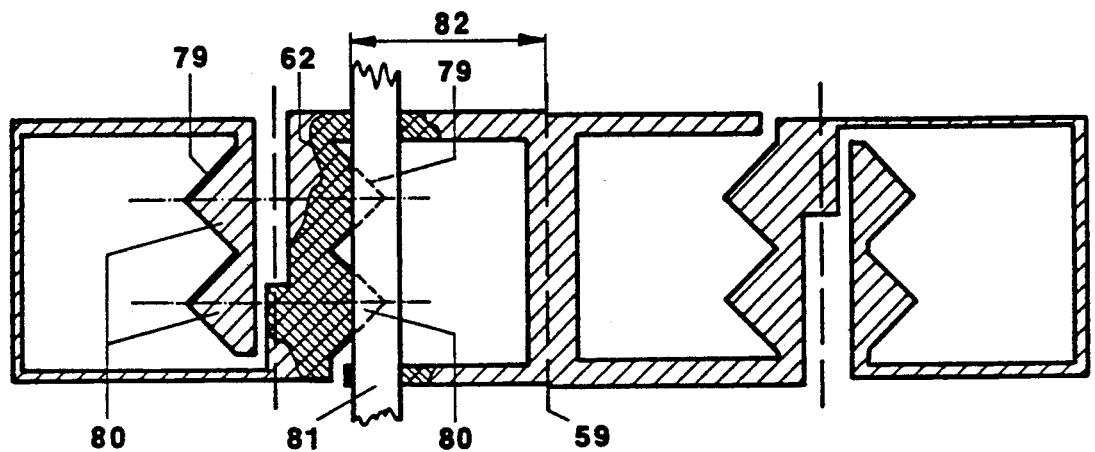

In a continuous manufacturing process of the described type the resonant frequency of the device can be maintained within predeterminable frequency limits regardless of any occurring variations of the properties of the dielectrics 45, 46 and 40, 41, 42, of the adhesive layer 62, or of the carrier sheet 56 and of any other process parameters in that, according to FIG. 10, contours 79 of capacitively active adjusting conductor strip portions 80 are provided obliquely relative to the direction of advance of the carrier sheet, and between said conductor strip portions 80 a continuous insulating tape 81 of sufficient width and having a rather low relative permittivity and sufficient thickness is inserted so as to extend in the direction of advance of the carrier sheet. Thereby the active circuit capacitance and thus the resonant frequency of the final device can be influenced in response to the track spacing 82 of said adjusting tape from the perforation line 59.

In this way a suitable closed control circuit which contactlessly detects the actual frequency of manufactured devices, continuously compares it with a predetermined set frequency, and the dynamic of which is tunable to the number of manufactured devices per unit of time, can control the maintenance of predetermined resonant frequency limits automatically via control of the track spacing.

The insertion of such an adjusting tape 81 can be effected either by rolling it onto the still unfolded structure after application of the adhesive layer 62 by utilizing the adhesion of said very layer, as shown in FIG. 10, or can be effected in the same way after the first folding operation by utilizing selective adhesive properties of the carrier sheet, as indicated in FIGS. 8 and 9, depending on the desired adjusting sensitivity.

Figure 13:
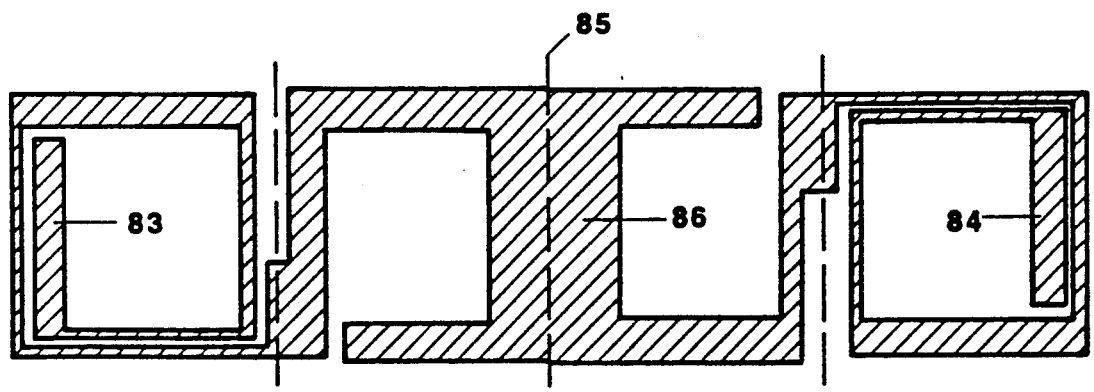
FIG. 13 is a plan view on a conductor strip structure developed into a plane for the manufacture of an outwardly shielded identification device with four superposed planes and increased inductance.

The inductance can be increased and the shielding effect improved while retaining the four-leaf principle shown in FIG. 13 by increasing the number of windings of the leaves inwardly disposed after folding. To this end the conductor strip portions 83 and 84 acting as capacitor coatings may be so arranged that they come to lie below the two outwardly disposed halves of the central conductor strip 86 of the structure last folded along the line 85 which has the lowest coupling impedance. This further improves the stability of the resonant frequency against capacitive approach.

The same effect is achieved when there are more than four leaves to one structure. The possible form of a multi-leaf structure which may also be asymmetrically continued on both sides in meander-fashion, is illustrated in FIG. 14. The required stepping of the conductor strip widths is only sketched.

Two-leaf devices can be produced rapidly and especially simply by producing from a thin metal foil 87 provided with a suitable dielectric coating 88 a flat conductor strip structure 91 composed of two partial leaves 89 and 90, as illustrated in FIG. 15, fixing it on an adhesive or sealable carrier sheet 65a, and then folding the latter together with the conductor strip fixed thereto along a line of perforation 92 produced without pitch shift and continuously penetrating the conductor strip structure and the carrier sheet so that the dielectric coatings are encased between the conductor strips of the folded structure. Here, too, the principle of electric conductance through a zone of perforation along a fold line is applied. If the starting material is a metal foil 87 bearing no dielectric coating 88, a dielectric 93 must be inserted between the two partial leaves as shown in FIG. 16. In this case, too, a Thomson oscillating circuit with distributed capacitances is formed.

Trial samples showed that fixing by a special adhesive layer 62 of the dielectric layers 88 to one another or of the conductor strip 87 to a dielectric 93 to be inserted becomes unnecessary if the structure is enclosed all around in the sheathing material 65 by a suitable sealing film 61.

In this embodiment, too, capacitor areas are most favorably disposed so that they are oriented lengthwise in winding direction, because in this way, as a component of the coil winding, they permit the maximum induction area with a minimum of field distortion.

If the superposed conductor strips are sufficiently large, special capacitor areas are unnecessary so that then the windings are open-ended, in the interior of the sheet structures.

If one departs from the principle of electrical condition through a perforated zone along a fold line and in the embodiment of FIG. 16 the electrically conductive connection along the perforation line 92 is separated one obtains a parallel resonant circuit, as shown in FIG. 19, with series arranged inductances 103 and 104 and series arranged capacitances 105 and 106 in that the capacitive coating becomes active as a serial capacitor 106 between the mutually insulated conductor strip halves 107 and 108 along the perforation line 92. In FIG. 19 also the distributed capacitances of the winding areas with respect to each other are indicated.

Such embodiment can be produced rapidly and simply, again with the application of the principle of unlike overlying conductor strip width for extensive frequency invariance relative to positioning inaccuracies, in that form a thin metal foil 87—which may already be provided with a suitable dielectric coating 88 on one side—two separate planar structures 109 and 110 are produced as shown in FIG. 17, and are fixed on an adhesive or sealable carrier sheet 65; in the same operational step the latter is continuously perforated without pitch shift between the structures, so that together with the conductor strip structures 109 and 110 positioned thereon—with a di-electric 93 inserted therebetween, if necessary—it may be folded along the resulting perforation line 111 so that the two conductor strip structures 109, and 110 lie one upon the other and are capacitively, rather than electrically, coupled through the insulating interlayer 88 or 93, as shown in FIG. 18, and the thus obtained resonant member is sealed on all sides within the carrier sheet 65 forming a protective sheath. In order to influence the resonant frequency, again an adjusting tape 81 is provided (FIG. 20) cooperating with adjusting areas 112, as explained in detail with reference to FIG. 10. The adjusting areas 112 are so constructed that there is approximately square response of the adjustment capacitance to the parallel shift of the adjustment tape 81, or linear response of the resonance frequency to said parallel shift.

Since the described identification device can be produced not only very rapidly and simply but also with a minimum of raw material waste, it is especially suitable for use in merchandise safeguarding identifying price tags.

According to FIG. 21, to this end a data-bearing double price tag 97 for example—consisting of a cash register section 98 provided with such an identification device and a customer's section 99 without such a device—can be produced by using as production facilitating carrier 165 an accordingly pre-printed sheathing material suited as a data-carrier medium, and by leaving adequate space between the structures fixed to said carrier so that, after folding along the perforation line 92 and sealing of the carrier, there alternate in succession one area provided with a resonant member 100 and one area without such a member. Thereafter this tape is provided with transverse perforations following the incorporated resonant members in predetermined spaced relation for separation of individual tags, and one transverse perforation 102 there-between for separating customer's and cash register sections.

In case merchandise and price data on such tags are not manually but automatically inputted into the cash register by means provided for this purpose, such a resonant member can also be contained in the customer's section, provided the customer's section is punched in a suitable place in the read-in apparatus directly after registration, and the resonant member in the interior thereof is thereby inactivated.

Since this device is not shielded against the environment, and merchandise safeguarding tags should be sized as small as possible, it may be that changes in the circuit capacitance and thus in the resonant frequency occur in case large areas thereof are covered by objects or body portions.

In order to minimize this effect, the following measures are taken according to preferred embodiments:

The sheathing material is made sufficiently thick, and
the essential portion of the oscillating circuit capacitance is located at the periphery of the device, i.e. commencing in the capacitive coating between the first windings and concentrated along the line of perforation;
the ends of the coil are terminated with capacitor coatings of only relatively small area;
the relative permittivity of the dielectric is made as high, and the relative permittivity of the sheathing material is made as low as possible.

As a component of electronic systems for theft detection of merchandise or for supervising the authorized access of persons conventional devices have been in use which comprise, in a rigid housing essentially consisting of two parts, an oscillating circuit composed of a coil winding 1 of bare of insulated wire and a capacitor 2 of conventional design connected to the ends of the coil winding.

The introduction of these parts in the hitherto customary way may be obviated in that, according to FIG. 22, one of the described resonant devices 118 is placed into an adequate flat recess 116 in the interior of a similarly designed casing 117; the paper or cardboardlike carrier sheath 65 of such a device can be provided with a perforation 119 within the encased resonant structure in order to receive a closing mechanism 120 that may be required for detachable mounting of the entire structure to garments 121.

If such a closing mechanism need not be inseparably connected to an identification device, and if the identification device itself is to be designed as a flexible, resistant, repeatedly usable tag 122, such a tag can be produced, according to FIG. 23, in that as production facilitating carrier 65—and thus as sheathing material of the resonant member—a sufficiently thick, tear-resistant material with bend-resistant reinforcement is used which can be sealed, if required, by a sealed seam 123 along the margins to render the device tear resistant.

A bore 125 in the inner area of such a tag whose margin is likewise reinforced by sealing 124 may permit detachable mounting to merchandise 121 with customary devices 126 suitable for this purpose.

I claim:

1. An LC structure for use in radio frequency security systems and resonant at at least one radio frequency, said LC structure comprising:

flexible insulative layer comprised at least of a dielectric layer (88) folded back on itself about a predetermined fold line (92; 111) with its inner surface either face to face or indirectly joined via at least one additional layer (62; 93) therebetween, said insulative layer having on one surface an electrically conductive layer (87) configured to form (a) first and second alike planar multi-turn spirals (89, 90; 109, 110), which, in cooperation, form an inductive element, (b) at least two substantially two-dimensionally shaped portions (107, 108; 114, 115), each electrically connected to a respective spiral (89, 90; 109, 110), symmetrically positioned on opposite sides of said fold line (92; 111), thereby being juxtaposed and having sandwiched therebetween at least said dielectric layer (88) to form a capacitive element, each of said portions (107, 108; 114, 115) having a substantially straight boarder parallel to and spaced a short distance from the respective substantially straight boarder of the other portion (107, 108; 114, 115), respectively, thus leaving therebetween an elongated region in which said conductive layer is at least predominantly absent, the two-dimensional shape of each of said two portions (107, 108; 114, 115) serving to thereby stiffen said insulative layer and to thereby cooperatively oppose any tendency of said (combined) insulative and conductive layers to fold along any line other than said predetermined fold line (92; 111) and thus precisely localize the fold such that said two symmetrically positioned portions (107 and 108; 114, 115) and spirals (89, 90; 109, 110) are precisely juxtaposed opposite each other so that each turn of said first spiral (89; 109) is aligned with a respective turn of said second sprial (90; 110) in a counter-turn relationship with respect to each other when both are viewed from the same side, to thereby form a series of stripline loops each having distributed inductive and distributed capacitive components, so that—by virtue of said precisely localized fold—a predictable capacitance for said capacitive element results which, in combination with said inductive element, causes said LC structure to resonate at said radio frequency.

2. The LC structure according to claim 1, wherein said substantially straight boarders and said elongated region in which said electrically conductive layer (87) is predominantly absent are formed of perforation openings in said conductive layer (87) along said fold line (92; 111).

3. The LC structure according to claim 1, wherein said electrically conductive layer (87) further comprises at least two electrically conductive bridging paths extending across said foldline (92) and connecting portions (107, 108 of 89, 90) of said configured electrically conductive layer (87 of 91) lying on each side of said line (92), and wherein said bridging paths are formed of conductive layer sections between successive perforation openings along said line (92) through said configured electrically conductive layer (87 of 91).

4. The LC structure according to claim 1, wherein said flexible insulative layer between said conductive multi-turn spirals configures at least with an outline substantially equal to the outline of said conductive multi-turn spirals.

5. The LC structure according to claim 1, wherein said insulative layer is a dielectric layer (88), which layer is folded back upon itself face to face such that the electrically conductive layer (87) on each side of the fold line (92; 111) remains on the outside, separated by at least two thicknesses of said dielectric layer (88).

6. The LC structure according to claim 1, wherein said insulative layer comprises a layer (88) having, for attaining a predetermined resonance response of the LC structure, preselected dielectric properties, which layer is folded back upon itself and its facing surfaces fixed together such that the conductive layer on each side of the foldline remains on the outside, separated by at least two thicknesses of said layer (88) having said preselected dielectric properties.

7. The LC structure according to claim 1, wherein said insulative layer is comprised of a first layer (88) having, for attaining a predetermined resonance response of the LC structure, preselected dielectric properties ties and a second layer (62) capable of developing a fixing power against itself and which second layer (62) is folded back upon itself so as to fix together and thereby indirectly join the similarly folded faces of said first layer (88) such that the conductive layer (87) on each side of the foldline (92; 111) remains on the outside, separated at least by two thicknesses of said first layer (88) and two thicknesses of said second layer (62).

8. The LC structure according to claim 1, wherein said insulative layer (88) is folded back towards itself onto the two faces of an additional inserted insulative layer (93) which is configured as a sheet.

9. The LC structure according to claim 1, wherein said insulative layer is comprised of a first layer (88) having, for attaining a predetermined resonance response of the LC structure, preselected dielectric properties and a second layer (62) capable of developing a fixing power and which second layer (62) is folded back towards itself onto the two faces of an additional inserted insulative sheet (93) so as to join the similarly folded faces of said first layer (88) such that the conductive layer (87) on each side of the foldline (92; 111) remains on the outside, separated at least by two thicknesses of said first layer (88), two thicknesses of said second layer (62) and the thickness of said sheet (93) which thereby is fixed, thus trapped between the inner surfaces of said first layer (88) by virtue of the fixing power of said second layer (62).

10. The LC structure according to claim 1 wherein a strip of insulative material (81) is additionally provided and arranged so as to extend between said first and second multi-turn spirals, across all of their turns, thus across the full LC structure width or length.

11. The LC structure according to claim 1 wherein said first and second multi-turn spirals have substantially different path widths.

12. The LC structure according to claim 1, wherein each of said first and second multi-turn spirals has a substantially constant path width, except the inner-most segment of each spiral which has a substantially greater width and thus more area per unit length.

13. The LC structure according to claim 1, wherein said first and second multi-turn spirals have substantially constant path widths, different from the the respective widths of said two-dimensionally shaped portions (107, 108; 114, 115).

14. The LC structure according to claim 1, wherein said multi-turn spirals (89, 90) comprise substantially straight conductive path segments parallel to said fold line (92), each outermost straight segment including one of said straight-sided portions (107, 108).

15. The LC structure according to claim 1, wherein said conductive and insulative layers, folded back towards themselves, are sealed and thus trapped between two insulative cover sheets (65) by aid of additional fixing means (61).

16. The use of the LC structure according to claim 1 in a security tag which is at least one of
paperface-like;
cardboard-like;
tear-resistant;
bend-resistively reinforced;
sealed.

17. The use of the LC structure according to claim 1 in at least one of
a tag for articles' theft detection;
a merchandise tag carrying price data and/or printed information;
a data carrying tag;
a self-adhesively fitted tag;
a data carrying dual-section tag (97), on at least one section (98) thereof the LC structure being provided;
an access control tag.

18. The use of the LC structure according to claim 1 in a tag for an electronic security system, wherein said LC structure is used at least in one of one-time tags and recirculation tags.

19. An LC structure for use in radio frequency security systems, said structure having at least one radio frequency tuned circuit with integrally formed inductive and capacitive elements, comprising at least
a flexible insulative layer having, for attaining a predetermined resonance response of the LC structure, a predetermined thickness and having first and second faces and an electrically conductive circuit pattern (91; 109 and 110; 87) affixed to one of said faces and defining at least first and second multi-turn inductive portions (89, 90; 109, 110), both portions being substantially alike and symmetrically positioned with respect to a reference line (92; 111) extending therebetween, and spiraling inwardly from their outer edges in opposite directions, an outermost leg (107, 108; 114, 115) of each of said inductive portions further having a substantially two-dimensional shape which includes a straight side which is parallel to the straight side of the matching leg of the respective other portion and is substantially spaced a short distance (marginal distance between 107 and 108; 114 and 115) therefrom, leaving therebetween an elongated region in which said conductive circuit pattern (91; 109 and 110; 87) is at least substantially absent, to thereby precisely define said reference line (92; 111) therebetween, wherein said flexible insulative 111) therebetween, wherein said flexible insulative layer is folded about said reference line (92; 111) with its facing surfaces being either directly or indirectly (62; 93) fixed together such that at least a double thickness of said flexible insulative layer lies between the folded portions (89, 90; 109, 110) of said circuit pattern (91; 109 and 110) and the respective turns of the respective inductive portions are precisely aligned with each other, the aligned portions and said insulative layer therebetween thus forming a distributed capacitive element, while the opposing conductive areas (107, 108; 114, 115) adjacent said reference line form respective plates of at least one more or less discrete capacitive element, the individual capacitive element and the distributed capacitive element adding to form the total capacitance of the tuned circuit.

20. The LC structure according to claim 19, wherein said insulative layer is configured as a pattern having substantially the same outline as has said electrically conductive layer (87).

21. The LC structure according to claim 19, wherein said insulative layer is formed of at least one of
a dielectric layer (88) having, for attaining a predetermined resonance response of the LC structure, defined dielectric properties and a first thickness, and
a sealing layer (62) capable of developing a fixing power against itself or against the surface of at least one dielectric layer (88; 93) and having a second thickness.

22. The LC structure according to claim 21, wherein said insulative layer is folded back towards itself onto the two faces of an additional inserted insulative sheet (93).

23. The LC structure according to claim 22, wherein said insulative sheet (93) has a third thickness and, for attaining a predetermined resonance response of the LC structure, defined dielectric properties.

24. The LC structure according to claim 19, wherein the material spacing said aligned inductive portions is assembled from at least two different materials (88; 62; 93; 81) provided in the form of layers each of which has a predetermined thickness.

25. The LC structure according to claim 19, wherein at least one electrically conductive bridging path extends across said reference line (92) and connects portions (107, 108 of 89, 90) of said electrically conductive circuit pattern (87; 91) lying on opposite sides of said line (92).

26. The LC structure according to claim 19, wherein said multi-turn inductive portiitons (89, 90; 109, 110) have substantially different path widths and are aligned so that wider path segments of the first inductive portion (90, 110) fully cover narrower path segments of the second inductive portion (89, 109), except in small zones of turn-to-turn path transitions.

27. The use of the LC structure according to claim 19 in a security tag which is at least one of
paperface-like;
cardboard-like;
tear-resistant;
bend-resistively reinforced;
sealed.

28. The use of the LC structure according to claim 17 in at least one of
a tag for articles' theft detection;

a merchandise tag carrying price data and/or printed information;

a data carrying tag;

a self-adhesively fitted tag;

a data carrying dual-section tag (97), on at least one section (98) thereof the LC structure being provided;

an access control tag.

29. The use of the LC structure according to claim 19 in a tag for an electronic security system, wherein said LC structure is used at least in one of one-time tags and recirculation tags.

* * * * *